(12) United States Patent
Renn et al.

(10) Patent No.: US 10,862,011 B2
(45) Date of Patent: Dec. 8, 2020

(54) LIGHT-EMITTING DEVICE WITH OPTIMIZED VIEWING ANGLE

(71) Applicant: EPISTAR CORPORATION, Hsinchu (TW)

(72) Inventors: Yih-Hua Renn, Hsinchu (TW); Ching-Tai Cheng, Hsinchu (TW); Chun-Hua Shih, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 27 days.

(21) Appl. No.: 15/260,469

(22) Filed: Sep. 9, 2016

(65) Prior Publication Data
US 2017/0077364 A1 Mar. 16, 2017

(30) Foreign Application Priority Data

Sep. 11, 2015 (TW) ................. 104130194 A (51) Int. Cl.
*H01L 33/40* (2010.01)
*H01L 33/50* (2010.01)
*H01L 33/62* (2010.01)

(52) U.S. Cl.
CPC .......... *H01L 33/508* (2013.01); *H01L 33/502* (2013.01); *H01L 33/62* (2013.01);
(Continued)

(58) Field of Classification Search
CPC ..... H01L 33/508; H01L 33/502; H01L 33/62; H01L 33/50; H01L 33/501; H01L 33/504; H01L 33/52; H01L 33/56
See application file for complete search history.

(56) References Cited

U.S. PATENT DOCUMENTS

| 8,722,439 B1* | 5/2014 | Tischler | H01L 33/32 |
| | | | 438/29 |
| 2006/0049335 A1* | 3/2006 | Suehiro | H01L 23/3121 |
| | | | 250/214.1 |

(Continued)

FOREIGN PATENT DOCUMENTS

CN 101958391 A 1/2011

OTHER PUBLICATIONS

Office Action for the related Chinese Patent Application No. 201610650286.7, dated Mar. 29, 2019, 11 pages.

*Primary Examiner* — Allen L Parker
*Assistant Examiner* — Gustavo G Ramallo
(74) *Attorney, Agent, or Firm* — Ditthavong & Steiner, P.C.

(57) ABSTRACT

A light-emitting device includes a light-emitting element and a wavelength conversion layer. The light-emitting element has a top surface, a bottom surface, a side surface, and a first electrical contact formed on the bottom surface. The distance between the top surface and the bottom surface has a first height (h1). The wavelength conversion layer has a first area (A1) located on the top surface of the light-emitting element and a second area (A2) located on the side surfaces and surrounding the first area. The first area has a second height (h2). The second area has a third height (h3) and a second width (w2). The second height (h2) is greater than the second width (w2). The difference of the third height and the sum of the first height and the second height is less than 15 μm.

7 Claims, 7 Drawing Sheets

(52) U.S. Cl.
CPC .............. *H01L 2933/0041* (2013.01); *H01L 2933/0066* (2013.01)

(56) References Cited

U.S. PATENT DOCUMENTS

| | | | | |
|---|---|---|---|---|
| 2009/0023234 | A1* | 1/2009 | Hsu | H01L 33/507 438/27 |
| 2009/0243467 | A1* | 10/2009 | Shimizu | C09K 11/7734 313/503 |
| 2009/0321758 | A1* | 12/2009 | Liu | H01L 33/505 257/98 |
| 2011/0102706 | A1* | 5/2011 | Oshio | H01L 25/0753 349/61 |
| 2011/0297978 | A1* | 12/2011 | Takeuchi | H01L 33/46 257/89 |
| 2014/0009060 | A1 | 1/2014 | Kimura et al. | |
| 2015/0318453 | A1* | 11/2015 | Hung | H01L 33/508 257/98 |

* cited by examiner

LIGHT-EMITTING DEVICE WITH OPTIMIZED VIEWING ANGLE

The present disclosure relates to a light-emitting device and manufacturing thereof, in particular to a light-emitting device has a uniform color distribution in different angle of view.

RELATED APPLICATION

This application claims priority to and the benefit of Taiwan Application Serial Number 104130194 filed on Sep. 11, 2015, which is incorporated herein by reference in its entirety.

DESCRIPTION OF THE RELATED ART

The light-emitting diodes (LEDs) of the solid-state lighting elements have the characteristics of low power consumption, low temperature, long operational life, strike resistant, small volume, quick response and so on so the LED is used in various applications of light-emitting devices, such as automobile, household appliance, lighting device, and so on.

There are several ways about converting the light emitting from the LED to another light. For example, covering a phosphor layer on the LED can achieve this purpose. The phosphor is a photoluminescence and wavelength conversion material. It can absorb a first light from the LED and emit a second light different from the first light. When the first light is not absorbed completely, a mixed light is produced by mixing the second light and the remaining first light while the mixed light has a color different from that of the first light and the second light.

If the mixing ratio of the remaining first light from the LED and the converted second light is different in different angle of view, the mixed light will have different color in different angle of view due to different mixing ratio. Therefore, the mixed light would have an un-uniform color distribution in different angle of view.

SUMMARY OF THE DISCLOSURE

Present disclosure discloses a light-emitting device. The light-emitting device includes a light-emitting element and a wavelength conversion layer. The light-emitting element has a top surface, a bottom surface, a side surface, and a first electrical contact formed on the bottom surface. The distance between the top surface and the bottom surface has a first height (h1). The wavelength conversion layer has a first area (A1) and a second area (A2). The first area (A1) is located on the top surface of the light-emitting element and has a second height (h2). The second area (A2) is located on the side surfaces and surrounding the first area and has a third height (h3) and a second width (w2). The second height is greater than the second width (w2). The difference of the third height (h3) and the sum of the first height (h1) and the second height (h2) is less than 15 μm.

Present disclosure discloses a manufacturing method of the light-emitting device. A plurality of light-emitting elements is formed on a carrier. Next, a wavelength conversion sheet is formed on the plurality of light-emitting elements. Then, the wavelength conversion sheet is diced to form a plurality of wavelength conversion layers. One of the plurality of light-emitting devices includes one of the plurality of wavelength conversion layers. The light-emitting element includes a top surface and a side surface, and the wavelength conversion layer includes a first area (A1) located on the top surface of the light-emitting element and a second area (A2) located on the side surface of the light-emitting element. The first area has a second height (h2), and the second height (h2) is greater than the width of the second area (A2).

Present disclosure discloses a light-emitting device. The light-emitting device includes a light-emitting element, a lens, and a wavelength conversion layer. The light-emitting element includes a first top surface, a bottom surface, a first side surface, and a first electrical contact. The first top surface connects the bottom surface by the first side surface. The first electrical contact formed on the bottom surface. The lens covers the first top surface and the first side surface. The wavelength conversion layer includes a second top surface and a second side surface. The second top surface is located on the lens and the second side surface is located out the side surface of the lens. The distance between the first top surface and the top surface of the lens is less than the distance between the first side surface and the side surface of the lens. The distance between the second top surface and top surface of the lens is greater than the distance between the second side surface and the side surface of the lens.

The following description illustrates embodiments and together with drawings to provide a further understanding of the disclosure described above.

DETAILED DESCRIPTION OF THE EMBODIMENTS

The drawings illustrate the embodiments of the application and, together with the description, serve to illustrate the principles of the application. The same name or the same reference numeral given or appeared in different paragraphs or figures along the specification should has the same or equivalent meanings while it is once defined anywhere of the disclosure. The thickness or the shape of an element in the specification can be expanded or narrowed.

Figure 1A:
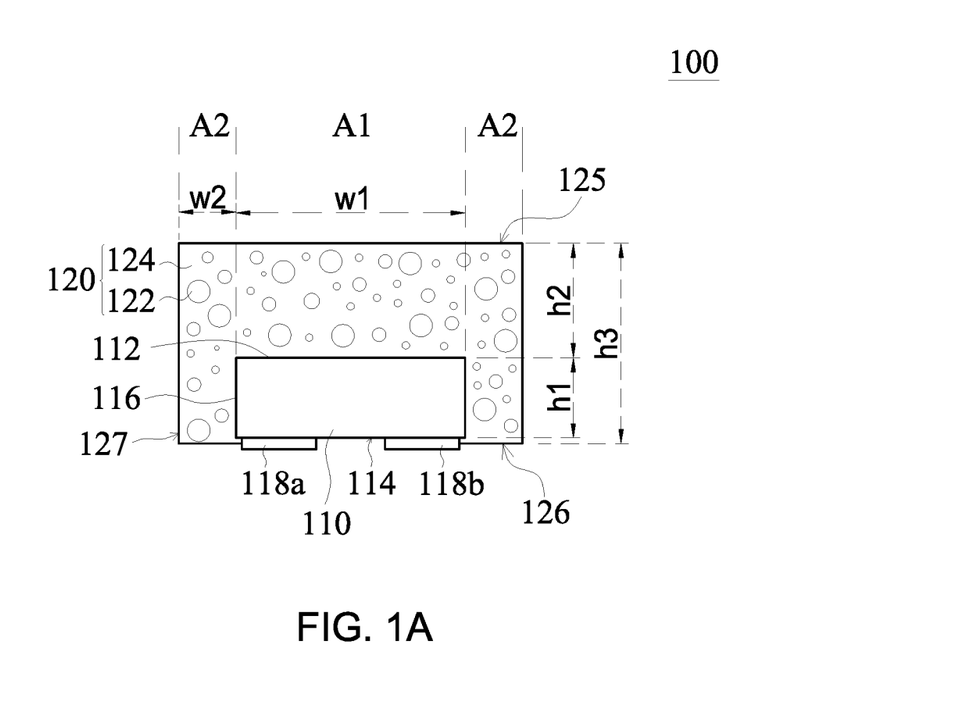
FIG. 1A and FIG. 1B show a cross-sectional view and a top view of a light-emitting device in accordance with an embodiment of the present disclosure.

FIG. 1A shows a cross-sectional view of a light-emitting device 100 in accordance with an embodiment of the present disclosure. The light-emitting device 100 includes a light-emitting element 110 and a wavelength conversion layer 120 covering the light-emitting element 110.

The light-emitting element 110 includes a top surface 112, a bottom surface 114, and a plurality of side surfaces 116. The top surface 112 connects the bottom surface 114 by the plurality of side surfaces 116. In an embodiment, the light-emitting element 110 is a flip chip LED die. In one embodiment, two electrical contacts 118a, 118b are formed on the same side of the light-emitting element 110 for light-emitting element electrically connecting the external power circuit. The light-emitting element is a stacked structure including a growth substrate, a first-type semiconductor layer, an active stack, and a second-type semiconductor layer (not shown) in sequence from the top surface 112 to the bottom surface 114. In an embodiment, the growth substrate has an outermost surface which is the light extracting surface of the light-emitting element 110. The growth substrate includes sapphire. In another embodiment, the stacked structure between the top surface 112 and the bottom surface 114 does not include the growth substrate or the growth substrate is removed from the stacked structure. The first-type semiconductor layer can be n-type semiconductor layer and the second-type semiconductor layer can be p-type semiconductor layer. In another embodiment, the light-emitting element 110 is a vertical LED die/chip, the electrical contacts 118a, 118b are formed on the top surface 112 and the bottom surface 114 and electrically connect to the first-type semiconductor layer and the second-type semiconductor layer respectively. Besides, the electrical contacts 118a, 118b protrude from the bottom surface 126 of the wavelength conversion layer 120 (as indicated in the figure) or are substantially coplanar with bottom surface 126 (not shown). Alternatively, only one of the electrical contacts 118a, 118b protrudes from the bottom surface 126 (not shown).

In an embodiment, the light-emitting element 110 includes four side surfaces. Two of opposite side surfaces are substantially parallel to each other. The top surface 112 is also substantially parallel to the bottom surface 114. The distance between the top surface 112 and the bottom surface 114 is defined as a first height (h1), a distance between the side surface and the opposite side surface is defined as a first width (w1). While measuring the first height (h1), the bottom surface 114 is the surface excluding the electrical contacts 118a, 118b. In other words, the bottom surface of the electrical contacts 118a, 118b is not the bottom surface 114 mentioned here. In an embodiment, the first height (h1) is of about 50 μm~250 μm; the first width (w1) is of about 900 μm~1500 μm. The light-emitting element 110 can be an LED die/chip, but is not limited to the blue LED die/chip or ultraviolet LED die/chip. In an embodiment, the light-emitting element 110 is the blue LED die/chip and emits a first light by be powered by external power supply. The first light has a dominant wavelength or peak wavelength in a range of 430 nm~490 nm.

The wavelength conversion layer 120 includes a transparent adhesive 124 and a plurality of wavelength conversion particles 122 dispersed in the transparent adhesive 124. The wavelength conversion particles 122 can absorb a first light from the light-emitting element 110 to convert to a second light with a peak wavelength or a light spectrum different from that of the first light. In another embodiment, the wavelength conversion particles 122 absorb the first light and convert to the second light which is yellow light with a peak wavelength or dominant wavelength in a range of 530~590 nm. In an embodiment, the wavelength conversion particles 122 absorb the first light and convert to the second light which is yellow-greenish light with a peak wavelength or dominant wavelength in a range of 515~575 nm. In another embodiment, the wavelength conversion particles 122 absorb a first light and convert to a second light which is red light with a peak wavelength or dominant wavelength in a range of 590~650 nm.

The wavelength conversion layer 120 includes one or more than two kinds of the wavelength conversion particles 122. In an embodiment, the wavelength conversion layer 120 includes the wavelength conversion particles which can convert the light to yellow light. In another embodiment, the wavelength conversion layer 120 includes more than two kinds of the wavelength conversion particles which can convert the light to yellow-greenish light and red light.

The wavelength conversion particles 122 include inorganic phosphor, organic fluorescent colorants, semiconductor, or combinations thereof. Semiconductor includes II-VI group semiconductor material, III-V group semiconductor material, IV-VI group semiconductor material, or combinations thereof. In an embodiment, the wavelength conversion particle 122 is phosphor which can be selected from the group consisting of $Y_3Al_5O_{12}$:Ce, $Gd_3Ga_5O_{12}$:Ce, $Lu_3Al_5O_{12}$:Ce, $(Lu, Y)_3Al_5O_{12}$:Ce, $Tb_3Al_5O_{12}$:Ce, SrS:Eu, $SrGa_2S_4$:Eu, $(Sr, Ca, Ba)(Al, Ga)_2S_4$:Eu, $(Ca, Sr)S$:(Eu, Mn), $(Ca, Sr)S$:Ce, $(Sr, Ba, Ca)_2Si_5N_8$:Eu, $(Sr, Ba, Ca)(Al, Ga)SiN_3$:Eu, CaAlSiON:Eu, $(Ba, Sr, Ca)_2SiO_4$:Eu, $(Ca, Sr, Ba)Si_2O_2N_2$:Eu, $K_2SiF_6$:Mn, $K_2TiF_6$:Mn, or $K_2SnF_6$:Mn. In an embodiment, semiconductor includes a semiconductor material with nano-crystal, such as quantum-dot which can be selected from the group consisting of ZnS, ZnSe, ZnTe, ZnO, CdS, CdSe, CdTe, GaN, GaP, GaSe, GaSb, GaAs, AlN, AlP, AlAs, InP, InAs, Te, PbS, InSb, PbTe, PbSe, SbTe, ZnCdSeS, and CuInS.

The wavelength conversion particles 122 can be dispersed in the transparent adhesive 124 and the relative positions of each wavelength conversion particles 122 can be fixed by the transparent adhesive 124. The weight percentage of the wavelength conversion particles 122 in the transparent adhesive 124 can be varied by adjusting the weight ratio of the transparent adhesive 124 and the wavelength conversion particles 122. When the weight percentage concentration of the wavelength conversion particles 122 is higher, more first light from the light-emitting element 110 is converted to the second light (the converting ratio is higher) and the scattering light is more obvious. However, the weight percentage concentration of the wavelength conversion particles 122 is too high, the wavelength conversion particles 122 may not be fixed by the transparent adhesive 124 because the percentage of the transparent adhesive 124 is too less. In an embodiment, the weight percentage concentration of the wavelength conversion particles 122 in the transparent adhesive 124 is less than 70%. In another embodiment, the weight percentage concentration of the wavelength conversion particles 122 in the transparent adhesive 124 is in a range of 25%~35%. If the weight percentage concentration of the wavelength conversion particles 122 in the transparent adhesive 124 is in a range aforementioned, the converting ratio and scattering effect are better, and the wavelength conversion particles 122 can be well fixed in the transparent adhesive 124. Furthermore, in order to get higher light extraction efficiencies of the first light which excites the wavelength conversion particles 122 and of the second light which is emitted from the wavelength conversion particles 122, the transparent adhesive 124 prefers to be a material with a higher transmittance for the first light and the second light, for example, the transmittance of the transparent adhesive 124 is more than 80%, 90%, 95%, or 99%.

The transparent adhesive 124 includes thermosetting materials. The thermosetting material includes but is not limited to epoxy resin or silicone resin. In an embodiment, the transparent adhesive 124 is silicone resin. The difference of the refractive indexes between the transparent adhesive 124 and the material of the light extracting surface of the light-emitting element 110 is less, the divergence angle is greater and the light extraction efficiency is improved. In an embodiment, the light extracting surface of the light-emitting element 110 is made of sapphire with a refractive index about 1.77 and the transparent adhesive 124 has the refractive index more than 1.5.

The wavelength conversion layer 120 can cover one or more than two light extracting surfaces of the light-emitting element 110. In an embodiment, the light extracting surfaces of the light-emitting element 110 include the top surface 112 and the side surfaces 116 and the wavelength conversion layer 120 covers the top surface 112 and side surfaces 116. In another embodiment, the wavelength conversion layer 120 directly contacts the top surface 112 and the side surfaces 116 of the light-emitting element 110. In another embodiment, the wavelength conversion layer 120 only covers or directly contacts the top surface 112 of the light-emitting element 110 and does not cover or directly contact the side surfaces 116.

Figure 1B:
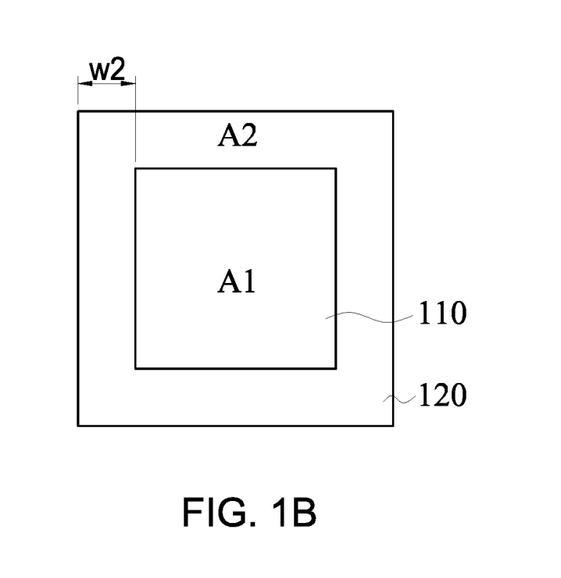

As shown in FIG. 1B (top view of FIG. 1A), the wavelength conversion layer 120 includes a first area A1 and the second area A2. In an embodiment, the first area A1 connects to the second area A2 and is positioned on the top surface 112 of the light-emitting element 110. The first area A1 has a second height (h2) as indicated in FIG. 1A. The definition of the second height (h2) is the distance between the top surface 112 of the light-emitting element 110 and the top surface 125 of the wavelength conversion layer 120. The second area A2 is disposed on the side surfaces 116 of the light-emitting element 110 and surrounds the first area A1. The second area A2 has a third height (h3) and a second width (w2) as indicated in FIG. 1A. The definition of the third height (h3) is the distance between the bottom surface 126 of the second area A2 and the top surface 125 of wavelength conversion layer 120. In an embodiment, the second height (h2) is in a range of 50 μm~1450 μm and the third height (h3) is in a range of 100 μm~1500 μm. The definition of the second width (w2) is the distance between the side surface 127 of the wavelength conversion layer 120 and the side surface 116 of the light-emitting element 110. In an embodiment, the second width (w2) is in a range of 50 μm~500 μm. In another embodiment, the sum of the first height (h1) and the second height (h2) is different from the third height (h3) by a value of less than 15 μm. Hence, the side surfaces 116 are enclosed by the wavelength conversion layer 120 to prevent the light from leaking out from the side surfaces 116 without passing through the wavelength conversion layer 120. Furthermore, even the wavelength conversion layer 120 is protruded from the bottom surface 114 of the light-emitting element 110, the electrical contacts 118a, 118b are not blocked from being bonded on the carrier.

In an embodiment, the second height (h2) is greater than the second width (w2). For example. The ratio of the second width (w2) to the second height (h2) is in a range of 0.4~0.6. The first light L1 emitted from the top surface 112 of the light-emitting element 110 has a first light power and the first light L1 emitted from the side surface 116 of the light-emitting element 110 has a second light power. If the first light power is greater than the second light power, when the thickness of the light conversion layer 120 located on the top surface 112 is equal to that located on the side surface 116, the distance of the first light L1 passing through the second height (h2) can be substantially equal to the distance of the first light L1 passing through the second width (w2). In that case, the light power of the second light L2 which is converted by the wavelength conversion particles 122 when the first light L1 passes through the second height (h2) is close to the light power of the second light L2 which is converted by the wavelength conversion particles 122 when the first light L1 passing through the second width (w2). As aforementioned, if the light power of the second light L2 in the forward direction which is vertical to the top surface 112 of the light-emitting element 110 is substantially equivalent to that in the lateral direction which is vertical to the side surface 116 of the light-emitting element 110, the mixing ratio of the remaining first light L1 and the second light L2 is different in the forward direction and the lateral direction because the light powers of the first light L1 in these two directions are different (the light power of the first light L1 in forward direction is greater than that in lateral direction). Therefore, the wavelength conversion layer 120 located on the top surface 112 has a thicker thickness and more percentage of the first light L1 is converted to the second light L2. Hence, the mixing ratio of the remaining first light L1 and the second light L2 in the forward direction is close to that in the lateral direction. Furthermore, because the wavelength conversion particles 122 can scatter and make the light diffusion uniform, the thicker wavelength conversion layer 120 on the top surface 112 of the light-emitting element 112 can make the mixed light produced by the first light L1 and the second light L2 have similar color over all view of angle.

Figure 2A:
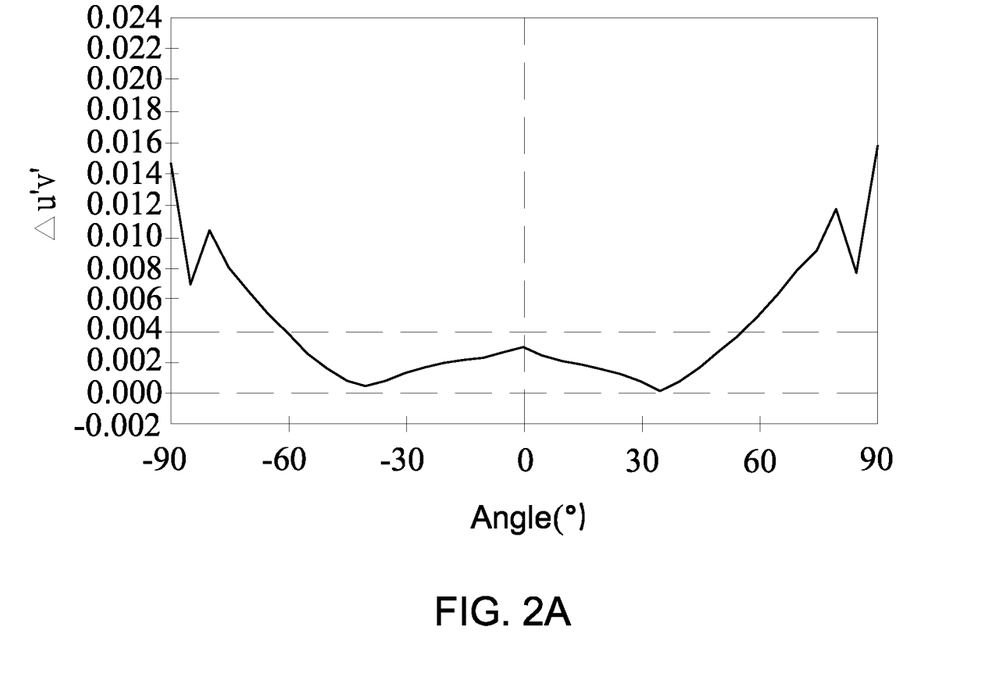
FIG. 2A and FIG. 2B show a graph of the angular color performance of a light-emitting device in accordance with a reference example and an embodiment of the present disclosure.
Figure 2B:
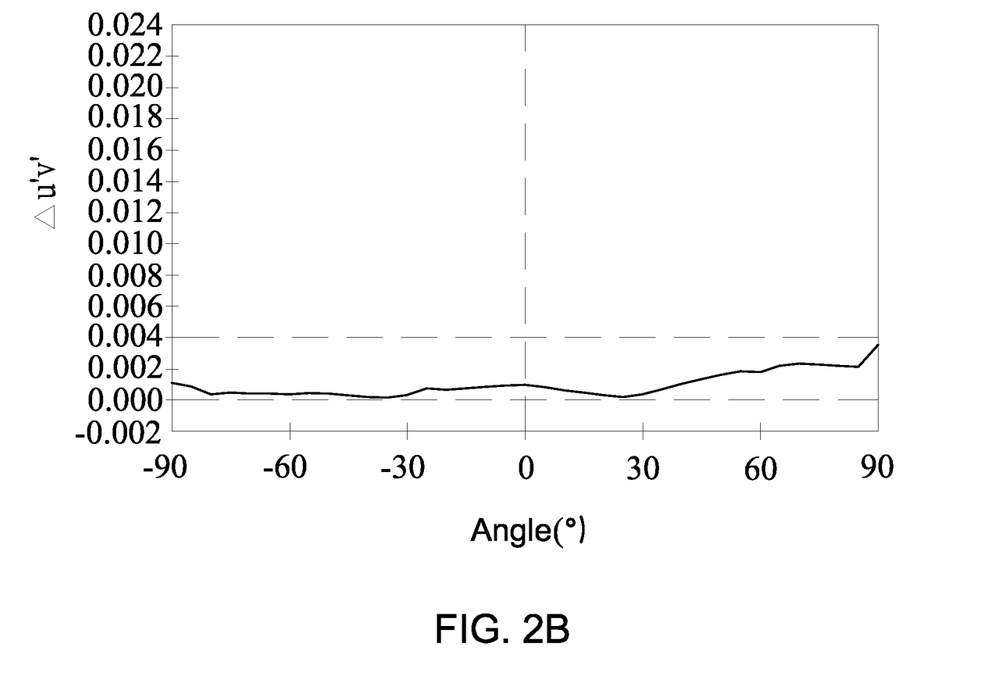

FIG. 2A and FIG. 2B show the graphs of angular color performance of the light-emitting devices of a reference example (FIG. 2A) and an embodiment (FIG. 2B) respectively. The graph of angular color performance shows how the color of the light emitted from the light-emitting device changes over the angle of the emitted light. The Table. 1 lists the dimension of the wavelength conversion layer 120 of the light-emitting devices of a reference example and an embodiment. The structure of the light-emitting device of the reference example and the structure of the light-emitting device of the embodiment are similar to those disclosed in FIG. 1A and FIG. 1B but are different in dimensions, while the weight percentage concentration (w/w) of wavelength conversion particles of each structure is in a range of 28%~31%. The unit of numerals shown in Table. 1 is micro meter (μm).

TABLE 1

|  | h1 | h2 | w2 | h2 |
|---|---|---|---|---|
| Reference example | 150 | 300 | 325 | 450 |
| Embodiment | 150 | 300 | 150 | 450 |

As shown in FIG. 2A and FIG. 2B, the coordinate X indicates the angle of view. 0° is corresponding to a direction vertical to the top surface 112. 90° and −90° are respectively corresponding to two opposite directions parallel to the top surface 112. Δu'v' shown on coordinates Y indicates the distance between any one point and a reference point ($u_0'$, $v_0'$) on the CIE1976 color space. The reference point ($u_0'$, $v_0'$) is defined as the average value of the color coordinates over all angles of the emitted light. $\Delta u'v'=(\Delta u'^2+\Delta v'^2)^{1/2}$, $\Delta u'=u'-u_0'$, $\Delta v'=v'-v_0'$, u' and v' indicate the color coordinates of that one point on the CIE1976 color space. The lager Δu'v' means the distance between that one point and the reference point is lager and the mixing ratio of the first light and the second light has larger difference with the average value.

In the angle distribution, less variation of Δu'v' means the color distribution over different angle of view is more uniform. As shown in FIG. 2B, the variation of Δu'v' over 0° to −70° is smaller than 0.004, which is smaller than that indicated in FIG. 2A, the color distribution of the light-emitting device of embodiment is more uniform than that of the reference example. The light-emitting device of reference example has the second height (h2) of 300 μm and the second width (w2) of 325 μm, and the second height (h2) is smaller than the second width (w2). The light-emitting device of embodiment has the second height (h2) of 300 μm and the second width (w2) of 150 μm, and the second height (h2) is greater than the second width (w2). The variation of Δu'v' over 0° to 30° is larger than 0.0015 indicated in FIG. 2A and is smaller than 0.001 indicated in FIG. 2B, therefore the color distribution of light-emitting device of embodiment is more uniform than that of the reference example over 0° to 30°. The variation of Δu'v' over 30° to 60° is about 0.004 shown in FIG. 2A and is smaller than 0.002 shown in FIG. 2B, therefore the color distribution of the light-emitting device of embodiment is also more uniform than that of the reference example over 30° to 60°. The difference of Δu'v' between the light-emitting device of reference example and the embodiment over 30° to 60° is greater than that over 0° to 30°. The variation of Δu'v' over 60° to 90° indicated in FIG. 2A is even about 0.01 and the variation of Δu'v' over 60° to 90° indicated in FIG. 2B is smaller than 0.002. Hence, the color distribution of the light-emitting device of reference example is worse over lager angle of view, and the color distribution of the light-emitting device of embodiment keeps substantially the same over all angle of view. Within a range of angle of 0°~90°, the variation of Δu'v' indicated in FIG. 2A is greater than 0.011 and the variation of Δu'v' indicated in FIG. 2B is smaller than 0.003. Therefore, when the ratio of the second width (w2) to the second height (h2) is in a range of 0.4~0.6, for example, the second width (w2) is 150 μm, the second height (h2) is 300 μm, the color distribution has a better uniformity.

Figure 3:
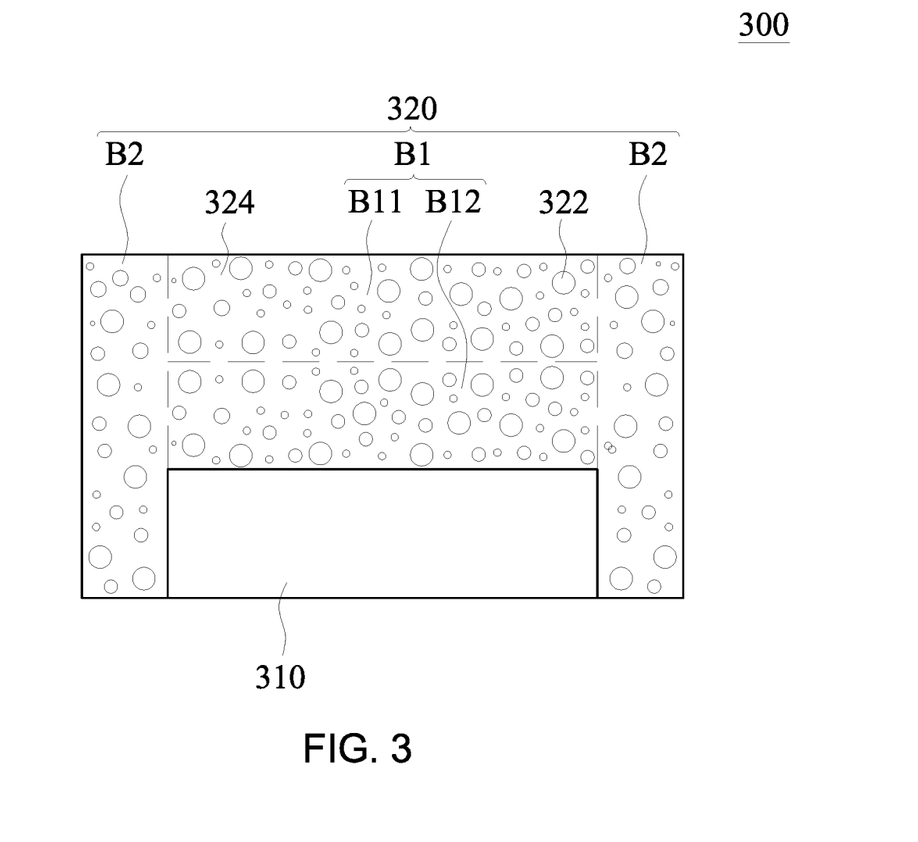
FIG. 3 shows a cross-sectional view of a light-emitting device in accordance with another embodiment of the present disclosure.

FIG. 3 shows a drawing of a light-emitting device 300 in accordance with another embodiment of the present disclosure. The light-emitting device 300 includes a light-emitting element 310 and a wavelength conversion layer 320 covering the light-emitting element 310. The wavelength conversion layer 320 includes a first area B1 and a second area B2. The first area B1 includes an upper area B11 and a lower area B12. In an embodiment, the difference of the average weight percentage concentration (or average density) of the wavelength conversion particles 322 between the first area B1 and the second area B2 is smaller than 5%. In another embodiment, the difference of the average weight percentage concentration (or average density) of the wavelength conversion particles 322 between the upper area B11 and the lower area B12 is smaller than 5%. The wavelength conversion layer can be divided into several different sub portions (for example, 3~10 sub portions), and the average weight percentage concentration (or average density) is defined as an average value of all of the weight percentage concentration (or density) of sub portions. The dimension of the sub portion is adjusted based on the size of the testing sample or the measuring method. For example, the sub portion can be 2-dimension or 3-dimension. If the sub portion is defined as 2-dimension, it can be octagon, hexagon, rectangle, triangle, round, oval, or combinations thereof. If the sub portion is defined as 3-dimension, it can be a cylinder, cube, cuboid, or sphere. The method using the thermogravimetric analyzer (TGA) to get the weight percentage concentration of the wavelength conversion particles measures the ratio of the weight of the wavelength conversion particles within the sub portion to the total weight of the sub portion. The method using the electron microscope to get the density of the wavelength conversion particles measures the total counts or total area of the wavelength conversion particles in a specific area (for example 100×100 μm$^2$) of the sub portion. The smaller difference of the weight percentage concentration (or density) of each sub portion and the average weight percentage concentration (or average density) means the wavelength conversion particles distributes more uniformly. Therefore, the wavelength conversion particles do not gather in an area of the transparent adhesive 324 that might produce too much heat thereon. The decay of transparent adhesive 324 caused by the heat can be reduced.

Figure 4A:
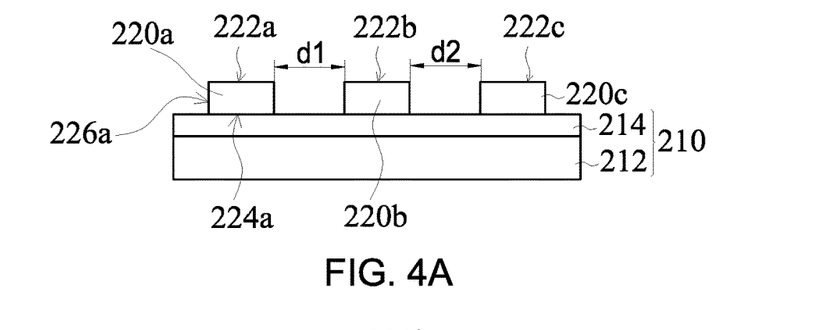
FIGS. 4A~4D show a manufacturing flow of a light-emitting device in accordance with an embodiment of the present disclosure.

FIG. 4A~FIG. 4D show a manufacturing flow of a light-emitting device 100 in accordance with an embodiment of the present disclosure. As shown in FIG. 4A, a carrier 210 is provided. The light-emitting elements 220a, 220b, 220c are provided and disposed on the carrier 210. The number of the light-emitting elements is an example and is not limited to three. The carrier 210 includes a carrier board 212 and an adhesive layer 214. In an embodiment, the carrier board 212 is a metal or a plastic and the adhesive layer 214 is a styrofoam, such as thermal release adhesive or UV curing adhesive. The light-emitting element 220a includes a top surface 222a, a bottom surface 224a, and a plurality of side surfaces 226a. In an embodiment, the bottom surface 224a directly contacts the adhesive layer 214. An aisle between the light-emitting element 220a and the light-emitting element 220b has a width d1 and another aisle between the light-emitting element 220b and the light-emitting element 220c has a width d2. The widths d1 and d2 can be the same or different. In an embodiment, the width d1 is the same as the width d2 and each of the widths d1 and d2 is in a range of 100 μm~1000 μm.

Figure 4B:
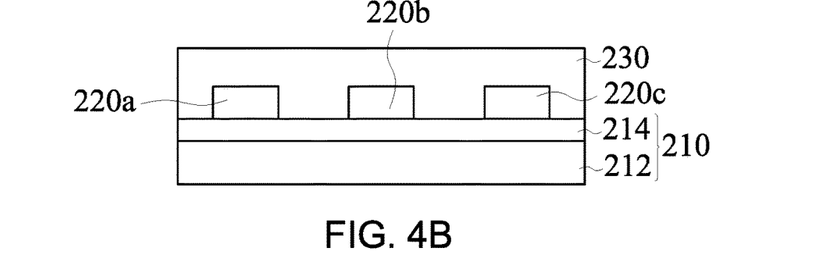

As shown in FIG. 4B, a wavelength conversion sheet 230 is formed on the carrier 210 and covers the light-emitting elements 220a, 220b, and 220c. The wavelength conversion sheet 230 is a sheet structure which is mixed by the plurality of wavelength conversion particles and the transparent adhesive. The size of the sheet structure can be adjusted based on the requirement, for example, the sheet structure is formed by the plurality of wavelength conversion sheets, and each of the wavelength conversion sheets is separated to each other. The plurality of separating wavelength conversion sheets covers the plurality of light-emitting elements correspondingly as a batch or in sequence. That is to say, one of the wavelength conversion sheets 230 only covers one or few light-emitting element (for example, the number of light-emitting element is smaller than 1/50, 1/100, or 1/200 of all light-emitting elements disposed on the carrier 210). In another embodiment, the wavelength conversion sheet is formed as a tape which can continuously cover the plurality of light-emitting elements in one step. That is to say, one wavelength conversion sheet 230 can cover multiple or all light-emitting elements (for example, the number of light-emitting element is more than 1/50, 1/100, or 1/200 of all light-emitting elements disposed on the carrier 210). In an embodiment, the wavelength conversion sheet 230 adheres to the top of the light-emitting elements 220a, 220b, 220c. The adhesive is made by tightly sealing an upper mold (not shown) and a lower mold (not shown), and heating and giving the pressure to the wavelength conversion sheet 230 at the same time for softening the wavelength conversion sheet 230. Then, the wavelength conversion sheet 230 tightly adheres to the light-emitting elements 220a, 220b, 220c. Alternatively, the air is extracted out when the upper mold is very close to the lower mold and the wavelength conversion sheet 230 does not contact the light-emitting elements 220a, 220b, 220c. The bubble between the wavelength conversion sheet 230 and the light-emitting elements 220a, 220b, 220c can be eliminated and the strength of joint can be enhanced.

Figure 4C:
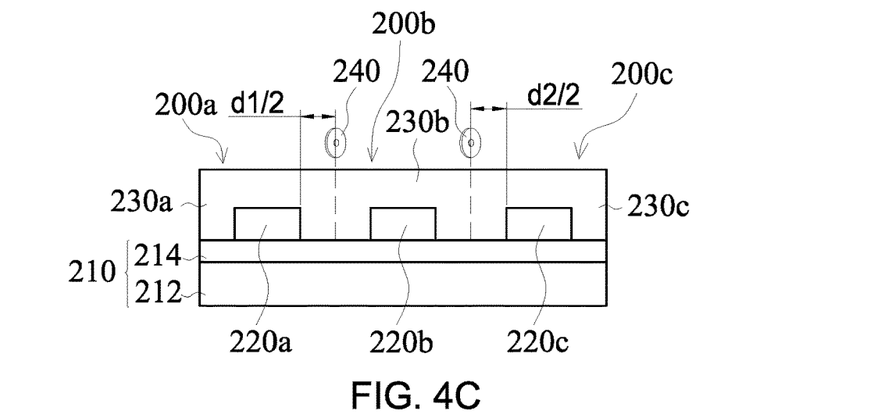

As shown in FIG. 4C, the wavelength conversion sheet 230 is diced by the dicing blade 240 and the light-emitting devices 200a, 200b, 200c are formed. The wavelength conversion sheet 230 is divided into several wavelength conversion layers 230a, 230b, 230c which cover the light-emitting elements 220a, 220b, 220c, respectively. The thickness of wavelength conversion layers 230a, 230b, 230c disposed on side surfaces of the light-emitting devices 200a, 200b, 200c (for example, the second width w2 of the second area A2 as indicated in FIG. 1A) is smaller than or about half of the width of the aisle (d). Taking the light-emitting device 200a as an example, the thickness (h2) of wavelength conversion layer 230a on the top of the light-emitting element 220a is greater than ½ of the width (d) of the aisle or is greater than the second width (w2) of the second area (A2) shown in FIG. 1A, and the light-emitting device has a better color uniformity.

Figure 4D:
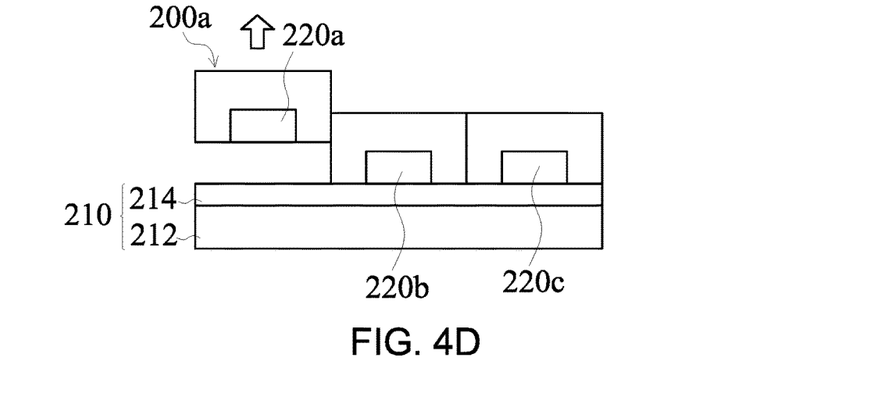

As shown in FIG. 4D, a light-emitting device is detached from the carrier 210 after dicing. Taking the light-emitting device 200a as an example, before detaching the light-emitting device 200a, the wavelength conversion layer 230a is cured by heating. The transparent adhesive within the wavelength conversion layer 230a is usually in a semi-cured state before heating, or is called as the b-stage. The transparent adhesive within the wavelength conversion layer 230a is transferred to a cured state after heating, or is called the c-stage. Besides, the light-emitting device 200a is easier to be separated from the adhesive layer 214 under a certain heating condition. In an embodiment, heating temperature is over 200° C. and the adhesive layer 214 can be separated from the light-emitting device 200a or the carrier 212.

Figure 5A:
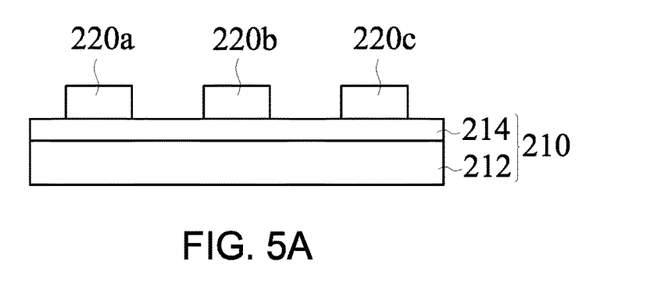
FIGS. 5A~5G show a manufacturing flow of a light-emitting device in accordance with another embodiment of the present disclosure.
Figure 5B:
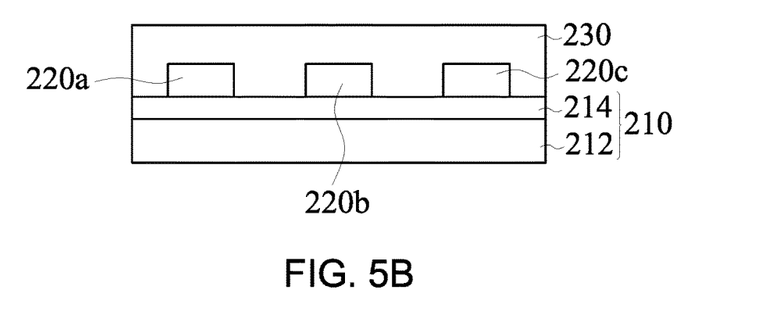
Figure 5C:
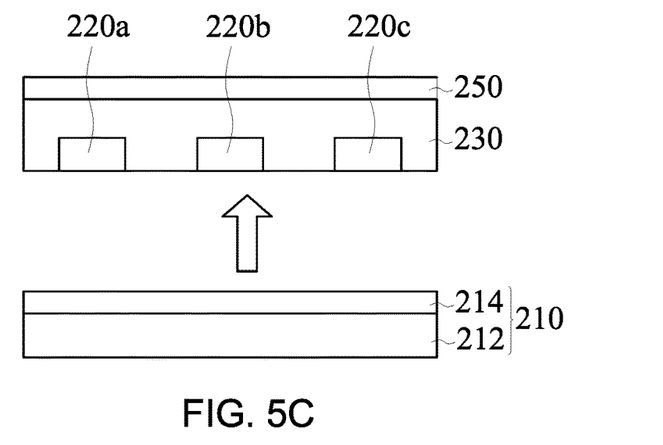

The heating temperature is higher and/or the curing duration is longer so the adhesive layer 214 forms the residue easily on the light-emitting device 200a or the carrier 212. FIG. 5A~FIG. 5G show a manufacturing flow of a light-emitting device 100 in accordance with another embodiment of the present disclosure. As shown in FIG. 5A, a carrier 210 is provided. The light-emitting elements 220a, 220b, and 220c are provided and disposed on the carrier 210. As shown in FIG. 5B, a wavelength conversion sheet 230 is formed on the carrier 210 and covers the light-emitting elements 220a, 220b, and 220c. As shown in FIG. 5C, the wavelength conversion sheet 230 is covered by the heat-resistant glue 250 and is proceeded with a heating. The light-emitting elements 220a, 220b, 220c are separated from the adhesive layer 214, then the curing process proceeds.

Figure 5D:
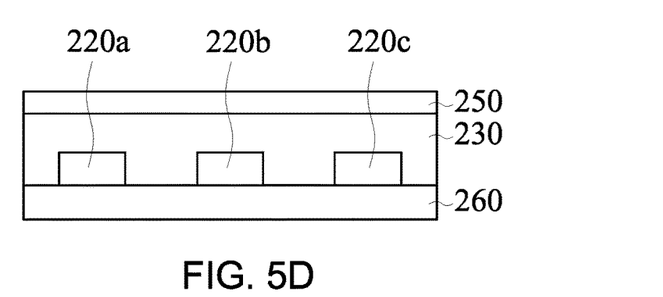
Figure 5E:
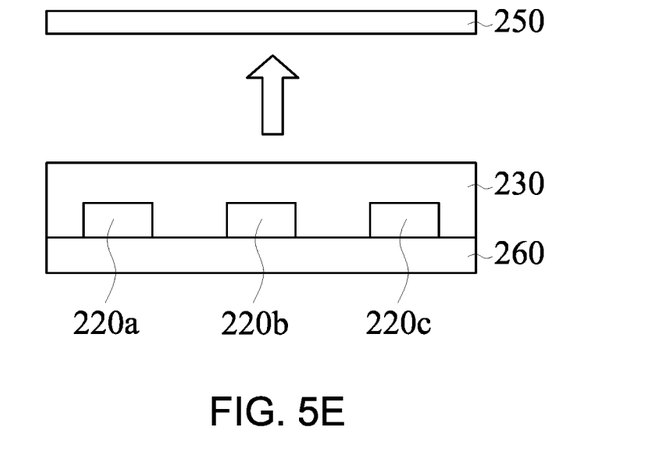
Figure 5F:
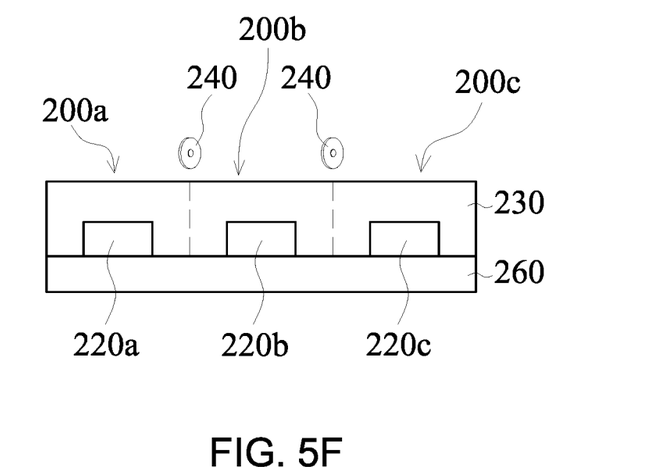
Figure 5G:
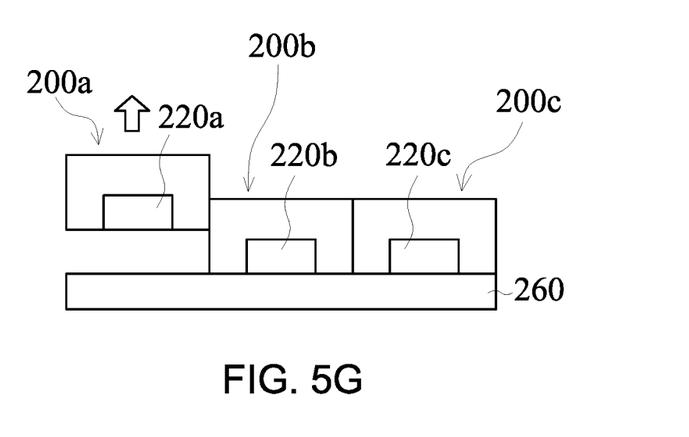

As shown in FIG. 5D, the wavelength conversion sheet 230 and light-emitting elements 220a, 220b, 220c are bonded to another carrier 260. The carrier 260 can be a blue tape or other material or structure which can support the wavelength conversion sheet 230 and light-emitting elements 220a, 220b, 220c. As shown in FIG. 5E, the heat-resistant glue 250 is separated from the wavelength conversion sheet 230. As shown in FIG. 5F, the wavelength conversion sheet 230 is diced by the dicing blade 240 and the light-emitting devices 200a, 200b, 200c are formed. As shown in FIG. 5G, the light-emitting device is detached from the carrier 260 after dicing. Because the heat-resistant glue 250 does not easily form the residue in high temperature or under the longer operating time, the wavelength conversion sheet 230 is easily detached from the heat-resistant glue 250.

Figure 6:
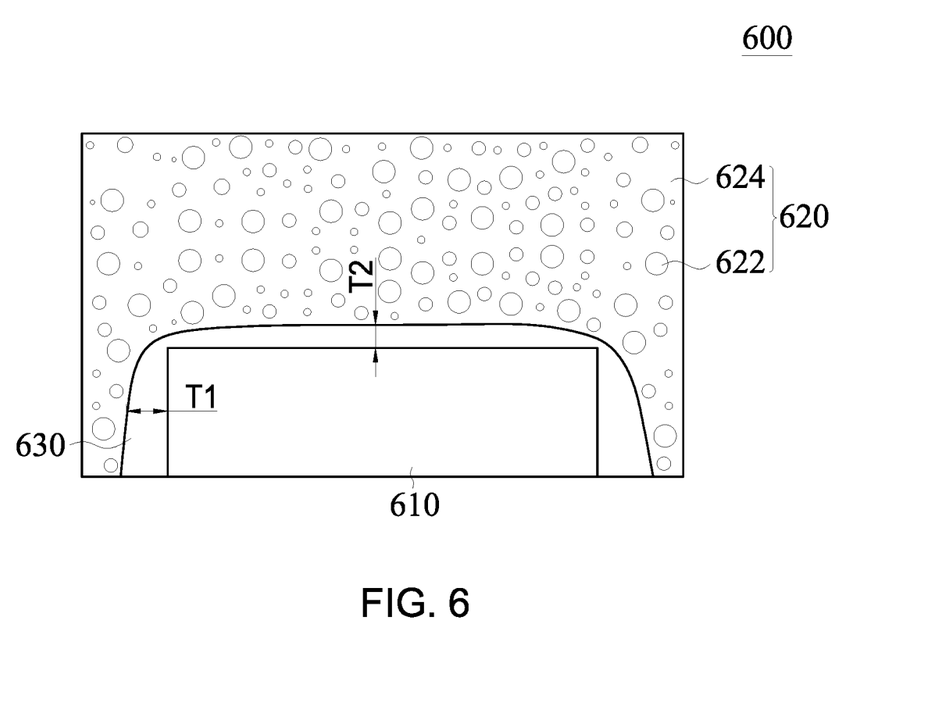
FIG. 6 shows a cross-sectional view of a light-emitting device in accordance with another embodiment of the present disclosure.

FIG. 6 shows a drawing of a light-emitting device 600 in accordance with an embodiment of the present disclosure. The light-emitting device 600 includes a light-emitting element 610 and a wavelength conversion layer 620 covering the light-emitting element 610. The wavelength conversion layer 620 includes a transparent adhesive 624 and a plurality of wavelength conversion particle 622 dispersed in the transparent adhesive 624. A transparent layer 630 is disposed between the light-emitting element 610 and the wavelength conversion layer 620. In an embodiment, the transparent layer 630 can be a lens like a convex lens. In an embodiment, the distance between the top surface of the light-emitting element 610 and the top surface of the transparent layer 630 is smaller than the distance between the side surface of the light-emitting element 610 and the side surface of the transparent layer 630. The distance between the top surface of the transparent layer 630 and the top surface of the wavelength conversion layer 620 is greater than the distance between the side surface of the transparent layer 630 and the side surface of the wavelength conversion layer 620.

In an embodiment, the distance between the side surface of the light-emitting element 610 and the side surface of the wavelength conversion layer 620 is equal to the distance between the top surface of the light-emitting element 610 and the top surface of the wavelength conversion layer 620. The average thickness ($T_1$) of the lateral portion of the transparent layer 620 is greater than the average thickness ($T_2$) of the top portion of the transparent layer 620. Therefore, the real average thickness of the wavelength conversion layer 620 covering the side surface of the light-emitting device 610 is smaller than the real average thickness of the wavelength conversion layer 620 covering the top surface of the light-emitting device 610. Hence, when the light extraction in the forward direction which is vertical to the top surface of the light-emitting device 600 is far greater than that in the lateral direction which is vertical to the lateral surface of the light-emitting device 600, the overall light extraction performance, such as light pattern, COA of light-emitting device 600 can be changed without changing the overall dimension of the light-emitting device 600 or the specification of the light-emitting element 610 by varying the density of the wavelength conversion particles 622 within the wavelength conversion layer 620 and the thickness of the transparent layer 630, which means varying the thicknesses of the top portion and the lateral portion of the wavelength conversion layer 620 by adjusting the thickness of the transparent layer 630. Furthermore, the transparent layer 630 separates the light-emitting element 610 from the wavelength conversion particles 622 and the conversion efficiency of the wavelength conversion particles 622 does not degrade by heat introduced by the light-emitting element 610. Moreover, the material of the transparent layer 630 is the same as or equivalent to that of the transparent adhesive 624, and the adhering strength between the wavelength conversion layer 620 and the transparent layer 630 is improved.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device, comprising:
a light-emitting element comprising a first top surface, a first bottom surface, a first side surface formed between the first top surface and the bottom surface, and a first electrical contact formed on the bottom surface;
a transparent layer, comprising a second top surface and a second side surface, and being free of a wavelength conversion particle, wherein the transparent layer covers the first top surface and the first side surface; and
a wavelength conversion layer, comprising a third top surface that is flat and located on the first top surface and a third side surface located out of the first side surface, and including a plurality of wavelength conversion particles;
wherein the light-emitting device has a first distance between the first top surface and the second top surface, a second distance between the first side surface and the second side surface, a third distance between the second top surface and the third top surface, and a fourth distance between the second side surface and the third side surface;
wherein the first distance is less than the second distance, the third distance is larger than the fourth distance.

2. The light-emitting device according to claim 1, wherein the transparent layer separates the light-emitting element from the wavelength conversion layer.

3. The light-emitting device according to claim 1, wherein the transparent layer further comprises a curved portion between the second top surface and the second side surface.

4. The light-emitting device according to claim 1, wherein the third side surface covering the first side surface.

5. The light-emitting device according to claim 1, wherein the third side surface covering the second side surface.

6. The light-emitting device according to claim 1, wherein the first distance has a variation along a direction of the first top surface.

7. The light-emitting device according to claim 1, wherein the third side surface is flat.

* * * * *